March 29, 1966

D. W. FLETCHER 3,243,742

VARIABLE RADIO FREQUENCY RESONATOR
WITHOUT SLIDING CONTACTS

Filed Dec. 9, 1964

2 Sheets-Sheet 1

INVENTOR.
DANIEL W. FLETCHER

BY Moody and Kintzinger
ATTORNEYS

March 29, 1966 D. W. FLETCHER 3,243,742
VARIABLE RADIO FREQUENCY RESONATOR
WITHOUT SLIDING CONTACTS
Filed Dec. 9, 1964 2 Sheets-Sheet 2

INVENTOR.
DANIEL W. FLETCHER

BY

Moody and Kintzinger
ATTORNEYS

United States Patent Office 3,243,742

Patented Mar. 29, 1966

3,243,742
VARIABLE RADIO FREQUENCY RESONATOR WITHOUT SLIDING CONTACTS

Daniel W. Fletcher, Agincourt, Ontario, Canada, assignor to Collins Radio Company, a corporation of Iowa Filed Dec. 9, 1964, Ser. No. 417,014
19 Claims. (Cl. 333—82)

Figure 1:
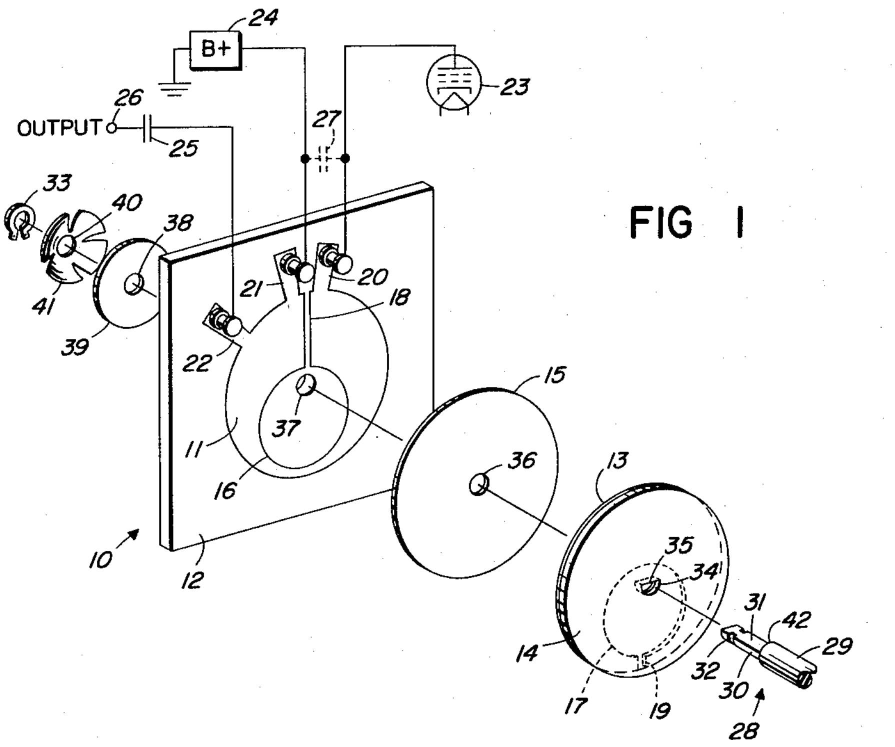

This invention relates in general to radio frequency tuning devices, and in particular to a wide frequency range variable resonator tuning device having substantially constant "Q" characteristics throughout the full range of frequency adjustment.

Various radio frequency tuning devices have problems of excessive loading in electronic tank circuits, particularly with the loading effects imposed by otherwise inactive circuit elements. By way of illustration, with reference to commonly known interleaved tuning capacitors, when such tuning devices are tuned to high frequencies, much of the capacitor leaf structure is unused. Such an unused leaf portion, or portions, appear as a loss element, or elements, having a loading effect which, while possibly inconsequential at low frequencies, in many cases becomes particularly serious at higher frequencies and especially so in UHF tuned regions.

It is, therefore, a principal object of this invention to provide a variable resonator tuning device having a wide range of adjustment and substantially constant "Q" characteristics throughout the full range of frequency adjustment.

Another object is to provide such a variable resonator with, throughout its range of adjustment, substantially no unused portion, or portions, subject to action as loss elements in an RF tank circuit.

A further object is to provide such a variable resonator tuning device without sliding contacts and having two plates with one plate rotationally movable relative to the other plate for providing the full range of frequency adjustment.

A further object is to provide such a variable resonator with its operation based on simultaneous change of inductance and capacitance in providing the desired wide frequency range adjustment characteristics.

Still further objects include providing such a variable resonator tuning device having good vibration chacteristics and with current carrying ability rather than structural requirements being the major factor determining weight and size requirements in a tuner particularly adaptable to printed circuit construction for low power applications and/or mechanical configurations.

Features of this invention useful in accomplishing the above objects include two relatively movable discs of electrically conductive material separated from direct electrical conductive interconnecting contact by a disc of dielectric material. The two discs (or plates) are generally of similar shape with single generally similar eccentrically located holes. It is a tuner forming part of an RF tank circuit with the eccentrically located holes being of such predetermined shape and size and so located as to provide simultaneous change of introduction and capacitance in the tuner as one disc, a tuning control disc, or plate, is rotated relative to the other disc, or plate. In one disc a radially extended slot is provided from the hole of that disc to the circumference of the disc through the enlarged area of electrically conductive material forming the disc between the eccentrically located hole and the circumference of the disc. In the other disc a radially extended slot is also provided but is provided at a location substantially 180° from the slot of the other disc and through the relatively short spacing of electrically conductive material where the spacing between the eccentrically positioned hole of that disc and the circumference of that disc is relatively narrow. This change of slot location is the only material difference between the two discs other than for the provision of lead circuit connection tabs provided with one of the discs. With this disc tuner construction, tuner inductance is decreased by appropriate relative rotation of the discs effectively enlarging the inductor area and effectively shortening the inductor path length.

A specific embodiment representing what is presently regarded as the best mode of carrying out the invention is illustrated in the accompanying drawings.

Figure 2:
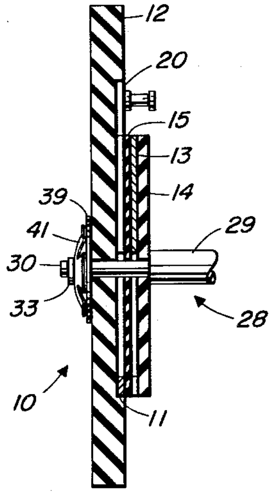
Figure 3A:
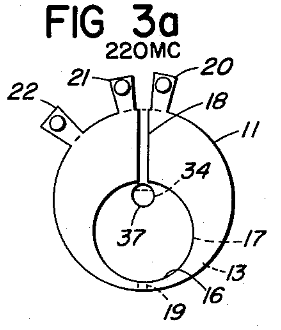
Figure 3B:
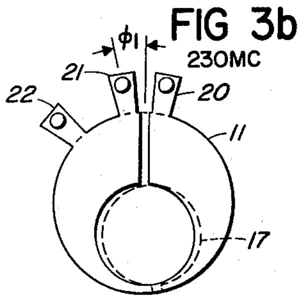
Figure 3C:
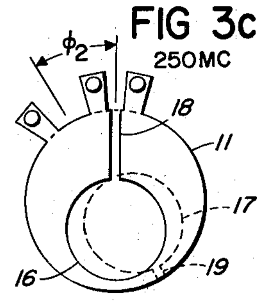
Figure 3D:
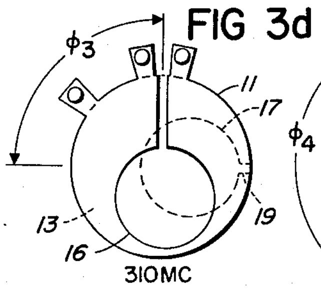
Figure 3E:
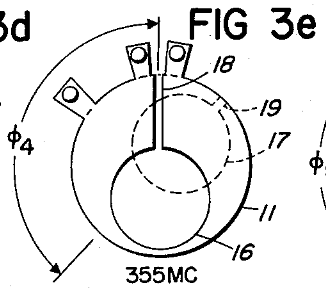
Figure 3F:
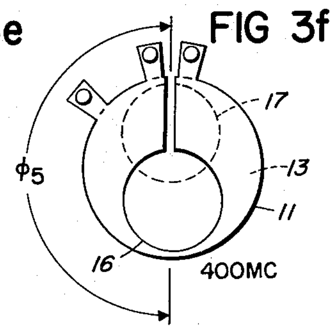
Figure 4A:
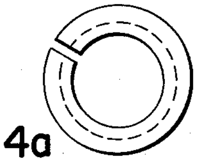
Figure 4B:
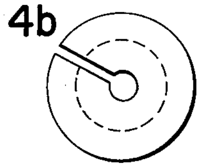
Figure 5:
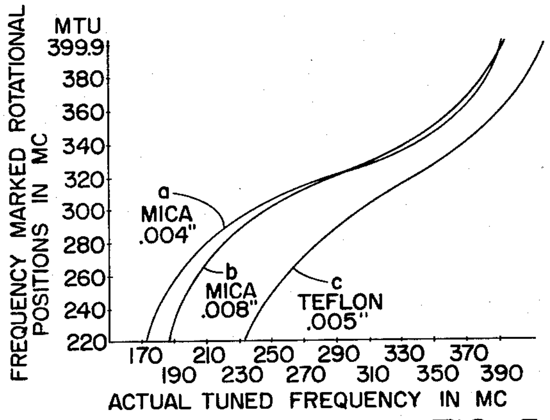
Figure 6:
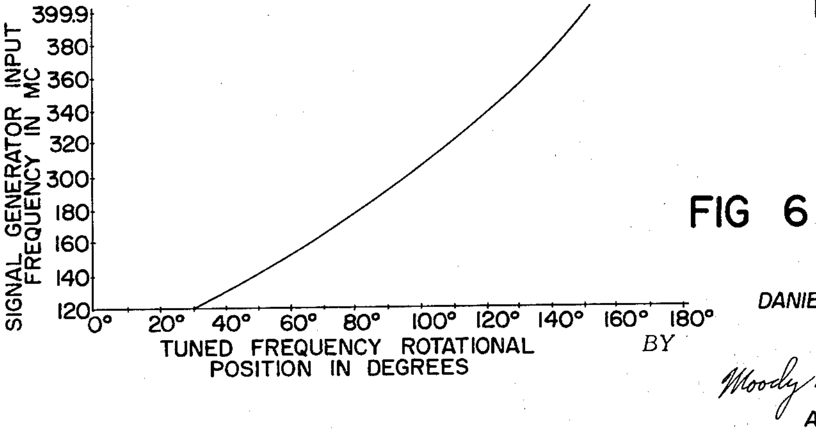

In the drawings:

FIGURE 1 represents an exploded perspective view and partial schematic of a variable resonator tank circuit according to the invention;

FIGURE 2, a cutaway and sectioned side view of applicant's variable resonator tuning device;

FIGURES 3(*a*) through 3(*f*) are partial views schematically illustrating relative operational disc tuning positions;

FIGURES 4(*a*) and 4(*b*) are schematic approximations of the average inductor circuit lengths for, the disc maximum inductance setting with the openings substantially aligned, and a minimum inductance position with the discs rotated to a position presenting maximum inductance area and with the shortest effective average inductor circuit length, respectively;

FIGURE 5, a graph of rotor disc position vs. frequency, with a variable resonator tank circuit according to the invention, of the performance for each of three different dielectrics between the relatively movable discs; and FIGURE 6, a graph curve of signal generator input to tuned frequency positioned of such a variable resonator tank circuit used as part of an operating amplifier.

Referring to the drawings:

Applicant's variable resonator tuning device 10 as shown in FIGURE 1, and as partially detailed in FIGURE 2, is a tank circuit of a relatively simple RF circiut. It consists of a conductive material primary disc 11 mounted on a plate 12. A second conductive material disc 13 mounted on a plate 14 of nonconductive material is mounted in parallel and aligned relation but spaced from the primary disc 11 by dielectric material disc 15. Obviously, the dielectric material disc 15 could be the mounting plate for the conductive material disc 13, without the requirement for an additional plate 14.

The conductive material discs 11 and 13 each have substantially circular outer circumferences of substantially the same diameter. Each of the two conductive material discs 11 and 13 is also formed with an eccentrically positioned circular openings 16 and 17, respectively, or circular areas of nonconductive material in the respective discs 11 and 13 with the circular openings substantially the same in the two discs and with a diameter approximately one-third the diameter of the discs 11 and 13. It should be noted, for example, that if it is important to have a linear frequency change per degree of rotation of control disc 13 relative to primary disc 11, the one or the other or possibly both of the openings 16 and 17 would have some shape other than being strictly round and possibly of somewhat different area than would be defined by circular openings one-third the diameter of the disc diameter. Further, the discs themselves may in some embodiments, for some operational requirements, have some departure from a precisely circular disc shape without departing from the basic teachings of the invention.

The conductive material primary disc 11 is provided with a radially extended slot 18 from the circular opening 16 to the circumference of the disc 11 with the slot extended through the area of conductive material of the primary disc of greatest thickness between the eccentrically positioned circular opening 16 and the circumference of the disc 11. This slot in the conductive material forming disc 11 presents an electrical barrier to otherwise a complete electrically closed conductive circular loop path through the conductive material of disc 11 around the opening 16. The conductive material control disc 13 is also provided with a radially extended slot; however, slot 19 of disc 13 extends from the circular opening 17 to the circumference of the disc 13 with the slot extended through substantially the narrowest area of conductive material of the disc 13 between the eccentrically positioned circular opening 17 and the circumference of the disc 13. This slot 19 in the conductive material forming disc 13 at a location rotationally substantially 180° from slot 18 of primary disc 11 presents an electrical barrier to otherwise a complete electrically closed conductive circular loop path through the conductive material of disc 13 around the opening 17.

Primary disc 11 is shown to have lead circuit connection tab and terminal extensions 20, 21, and 22 with tab 20, which extends radially outward from the disc 11 closely adjacent one side of slot 18, connected to the output plate electrode connection of an amplifier 23. A B+ voltage power supply 24 is connected to radially outward extended tab and terminal extension 21, closely adjacent the other side of slot 18, through conductive material disc 11 and the tab and terminal extension 20 to the plate electrode connection of amplifier 23. The tab and terminal extension 22 is connected through a coupling capacitor 25 to an output signal coupling terminal 26. It should be noted that various input or output impedance levels may be obtained by locating tab and terminal extension 22 at various different rotational positions at the periphery of primary disc 11 for obtaining various desired impedance levels. A shunt capacitor 27 of predetermined value, as desired, may be connected between leads of connection tab and terminal extensions 20 and 21 as shown in phantom to alter the operational frequency tuning range of the tank circuit.

In order that the variable resonator tuning device 10 may be an assembled tunable operating unit, a tuning shaft 28, preferably of insulating material to minimize electronic frequency varying effects upon the tank tuning circuit, is provided. It is a tuning shaft having an extension 29 from a tuning knob or tuning servo driven tuning drive motor, not shown, and having an extension 30 with a flat 31 and adjacent the end of extension 30, remote from the extension portion 29, a retaining ring groove 32 for receiving retaining ring 33. Plate 14 is provided with an opening 34 having a flatted portion 35 so that the opening fits the extension 30 of tuning shaft 28 with the flatted portion 35 engaging flatted surface 31 of the tuning shaft in a keying relation in order that plate 14 and the conductive material tuning disc 13 may be tunably rotated in keyed relation with the tuning shaft as driven by the tuning shaft 28. Dielectric material disc 15 is provided with a circular opening 36 that permits relative rotational movement of the tuning shaft 28. Obviously, if disc 13 were mounted on the outer side of the dielectric material disc 15, opening 36 would be shaped for keyed tuning rotation with the tuning shaft 28 just the same as with opening 34 of plate 14. Plate 12 with the conductive material mounting disc 11 is also provided with an opening, opening 37 through which the extension 30 of tuning shaft 28 extends in free relative rotational relation. The extension 30 of tuning shaft 28 immediately in back of plate 12 is passed through opening 38, in free relative rotational relation, of a relatively thin flat washer 39, preferably of nonmetallic and electrically nonconductive material. The tuning shaft extension 30 is next passed through an opening 40 of a "Belleville" type spring washer 41, preferably of an electrically nonconductive and nonmetallic material. The "Belleville" spring washer 41, resiliently confined in a partially resiliently compressed state between retaining ring 33 on extension 30 of tuning shaft 28 and the flat washer 39, exerts resiliently biasing pressure, maintaining the plates 12 and 14 and discs 11, 13 and 15 in resiliently biased abutting operational relation in biased reaction against the abutting shoulder 42 formed at one end of extension 29 at the adjacent attached end of extension 30. This presents a variable resonator tuning device having good vibration characteristics and with current carrying ability required tending to be the major factor in determining weight and size requirements rather than structural requirements being the major factor and, further, it presents a structure particularly adaptable to printed circuit construction for low power applications and also for mechanical configurations.

The embodiment illustrated shows a tank circuit produced using printed circuit components. It is a tank circuit that, in addition to use as an RF tuning tank in a receiver or translator, may be utilized in other circuits, one being for example, as an absorption trap. Obviously, the actual resonate frequency obtained when incorporated in a utilizing circuit depends not only on tank dimensions but also on stray inductance and capacitance factors present. Again it should be noted that if linear frequency change per degree of rotation of the tuning shaft and conductive material tuning control disc 13 is required, either one or both of apertures 16 and 17 would have to have some shape other than circular.

Referring also to FIGURES 3(*a*) through 3(*f*), as the two discs 11 and 13 are superimposed in the position shown in the exploded perspective view 1 and FIGURE 3(*a*), the lowest operational frequency in the possible tuning range is the tuned frequency provided for that tuning control rotated position of tuning control disc 13. The discs 11 and 13, by tuning control rotation of the tuning control disc 13, as driven by tuning shaft 31, are progressively tuning control positioned as illustrated in FIGURES 3(*a*) through 3(*f*), with tuned frequencies, in a working embodiment, of 220 mc., 230 mc., 250 mc., 310 mc., 355 mc., and 400 mc., respectively as indicated in the drawing with the respective tuned disc positions shown.

Various units have been built and tested with one in quite simple form having consisted of two copper discs 1½ inches in diameter separated by a paper dielectric. This unit provide a tuning range from 225 mc. to 400 mc. when an 8 micromicrofarad capacitor was soldered as the capacitor 27 across slot 18.

A second tank circuit device was a printed circuit device, such as illustrated, with mica as the insulating dielectric material disc 15. This unit utilized a 3.3-micromicrofarad capacitor 27 across the slot 18 in providing an operating frequency range from 150 mc. to 450 mc. and was utilized as a tank in a receiver in the RF plate circuit operating at 243 mc. This new tank circuit was found to provide an improved signal-to-noise ratio in an RF receiver over the signal-to-noise ratio obtained in the receiver with the original coil and capacitor that had been replaced.

A third tuning device unit was also a printed circuit unit and was incorporated in a complete oscillator circuit. This oscillator circuit included a double tuned cathode coupled multivibrator using a 6021 tube in which, although leads were not kept particularly short, no difficulty was presented in providing a frequency tuning range with strong oscillations from 155 mc. to 230 mc.

Another tank circuit utilizing metallic discs shaped according to the invention, approximately ¾ inch in diameter, and with a 10 micromicrofarad capacitor 27 shunted across the gap of the primary disc, was found to provide a tuning range of approximately 300 mc. to 400 mc. With such tank circuits, it is important to give consideration to the shunt capacity that is required with the tank circuit to make it useful in a practical circuit for desired operational tuning objectives. Changing the dielectric used in such a circuit tuning device can be of material significance, for example, in changing the dielectric to one of higher "K," the tuning range may be extended to lower frequencies, and, conversely, reducing the shunt capacity tends to expand the range of frequencies that may be tuned to higher frequency levels.

Referring now also to FIGURES 4(*a*) and 4(*b*), the schematic approximations are shown of the maximum and minimum inductance positions in illustrating how shortening of the inductor comes about. FIGURE 4(*a*) represents schematically the averaged minimum area of the inductor when in the maximum inductance position and corresponds to the relative disc rotated position as represented by the showing of the discs in FIGURE 3(*a*). FIGURE 4(*b*) represents schematically the other extreme position, corresponding to the relative rotated disc position of FIGURE 3(*f*), with a schematic showing of maximum inductor area of the inductor in the minimum inductance position. The length of the dotted line in each case schematically represents the average inductor length. Further, it should be particularly noted that additive to the progressive change in going from maximum inductance path length to minimum inductance path length is a progressive change in movement between the two extremes of increasing disc surface area. This becomes readily apparent by reference to FIGURES 3(*a*) through 3(*f*) or by physically taking two discs of such a tank circuit and revolving one disc relative to the other disc even though the exact shape of the inner opening through the combined discs is not a circle place at the center.

FIGURES 5 and 6 are curves taken with actual operation of a variable resonator tuner device tank circuit according to the invention with the graphs showing substantially natural tuning curves. As shown, particularly in the graph of FIGURE 6, the plotted graph through the center of a tuning range of such a variable tuning resonator device is quite flat. Here, again, it should be noted that appropriate variation in the shape of the aperture of one or the other or both of the discs should provide substantially improved linearity throughout the operating range of the curves plotted in FIGURES 5 and 6. In a tuning device unit circuit providing the curves plotted in FIGURE 5, the tuning control disc 11 was driven by a mechanical tuning unit through 180° of operational positions with the heading MTU being frequency markings corresponding to mechanical tuning positions through the 180° operation that are applicable with use of the tuning device in a certain existing transceiver. At each position, the frequency to which the tank was tuned is indicated. Here it is of particular interest to note again the effect that change in dielectric has upon the tuning characteristics of the device, with curve (a) using a mica dielectric 0.004 inch thick; curve (b), the tuning curve obtained with a mica dielectric 0.008 inch thick; and curve (c), the tuning curve obtained with a Teflon dielectric 0.005 inch thick. The upper frequency limits of these tuning device circuits are controlled to some extent by circuit capacity and to some further extent by circuit loading. It appears that with such a tuning device tank circuit including construction details as indicated with FIGURE 5, the maximum capacity value permissible for a shunt capacitor 27 across the tank while retaining the possibility of still reaching 400 mc., is limited to approximately 7 to 8 micromicrofarads. With units using capacity this high, it becomes necessary that the construction be of heavy material and to be structurally of a self-supporting nature.

The plotted graph of FIGURE 6 was made by tuning the variable resonator tank circuit to the frequencies and reading off rotation from calibration marks on the rotor. Actually, the tank of the particular unit tested had a greater frequency range than required for the circuit and if it were desired that the range be decreased to spread the path over 180° of rotation, the dielectric could be changed to one of lower "K". With this tank as part of an operating amplifier, a signal generator applied the frequencies indicated in the left column while the control rotor and the disc 13 were revolved to tune that frequency. As the tank had greater range than required, the lowest frequency was set when the disc 13 and the tuning shaft 28 were set 30° from their lowest rotational tuning position and the highest tuned frequency was reached rotatably 25° before the top rotational tuning position of the disc 13 and tuning shaft 28.

Whereas this invention is here illustrated and described with respect to a specific embodiment thereof, it should be realized that various changes may be made without departing from the essential contributions to the art made by the teachings hereof.

I claim:

1. In a variable resonator RF tuning device, a conductive material primary disc; means mounting said primary disc; a conductive material tuning control disc; means rotatably mounting said tuning control disc in spaced parallel relation relative to said primary disc; a dielectric between said discs; said discs being of substantially the same shape and size with the conductive material of each disc defining substantially a planar area contained within an outer circumference, and between the outer circumference and a peripheral edge defining an opening of substantially smaller size than the area of the disc, and with the opening eccentrically located within the area defined by the circumference of the disc; a slot in each disc defined by a gap in the conductive material of the respective disc and with the slot extending from the opening within the disc to the circumference of the disc; and with the slot in one disc being passed through the conductive material area of substantially maximum breadth, and with the slot in the other disc being passed through the area of substantially narrowest breadth between the opening and the circumference of the respective discs.

2. The variable resonator RF tuning device of claim 1, wherein the slot of one disc is located relative to the shape of the discs rotationally substantially 180° from the slot of the other disc.

3. The variable resonator RF tuning device of claim 1, wherein RF signal input means and RF signal output means are provided with one of said discs.

4. The variable resonator RF tuning device of claim 3, wherein the relative rotational locations of the RF signal input means and the RF signal output means associated with one of the discs are located at predetermined rotational locations about the disc for obtaining a predetermined desired impedance level through the variable resonator RF tuning device.

5. The variable resonator RF tuning device of claim 3, as used in a variable resonator tank circuit, wherein input and output circuit connections are made to said RF signal input and RF signal output means, with the circuit including a voltage biased element; voltage supply means for voltage biasing said voltage biased element; and means for connecting said voltage supply through the disc equipped with the RF signal input and RF signal output means to the voltage biased element.

6. The variable resonator tank circuit of claim 5, wherein the RF signal input means and the RF signal output means are circuit connection terminals; with one of said terminals being located adjacent the slot of the respective disc and with the means for connecting said voltage supply through the disc including a terminal adjacent the slot in the respective disc at the other side from the terminal located adjacent the other side of the slot of that disc.

7. The variable resonator tank circuit of claim 6, wherein a capacitor is connected between the terminals located adjacent opposite sides of the slot of the respective disc.

8. The variable resonator RF tuning device of claim 1, wherein said dielectric between said discs is a plate of dielectric material interposed between the discs and in contact with the discs and with the plate of dielectric being a determinate factor in the spacing between the parallel spaced discs.

9. The variable resonator RF tuning device of claim 1, wherein said conductive material primary disc is mounted on a fixed plate of dielectric material; said dielectric is a sheet of dielectric material between said discs; said tuning control disc is mounted on a rotatably mounted plate of dielectric material; and a rotatable tuning drive member is interconnected in driving relation with said rotatably mounted dielectric plate mounting the tuning control disc.

10. The variable resonator RF tuning device of claim 9, wherein said rotatable tuning drive member is a rotatable tuning shaft keyed to the rotatably mounted dielectric plate mounting said tuning control disc; and structural means biasing said discs and plates together in operational assembled tuning relationship.

11. The variable resonator RF tuning device of claim 10, wherein said tuning shaft has an abutment shoulder; and said structural means includes a spring device and retaining device mounted on said tuning shaft and biasing the discs and plates of the variable resonator together in operational relation.

12. The variable resonator RF tuning device of claim 1, wherein the openings of each of said discs is substantially of circular shape.

13. The variable resonator RF tuning device of claim 12, wherein said openings are of substantially the same size.

14. The variable resonator RF tuning device of claim 13, wherein the discs are substantially circular.

15. The variable resonator RF tuning device of claim 14, wherein the diameter of the eccentrically located openings falls in the range of approximately one-third to one-half the diameter of the respective discs.

16. The variable resonator RF tuning device of claim 1, wherein said discs are metallic plates.

17. The variable resonator RF tuning device of claim 1, wherein said discs are printed conductive material discs mounted on dielectric material substrates by printed circuit techniques.

18. In a variable resonator RF tuning device, a conductive material primary disc; means mounting said primary disc; a conductive material tuning control disc; means rotatably mounting said tuning control disc in spaced parallel relation relative to said primary disc; a dielectric between said discs; said discs being of substantially the same shape and size with the conductive material of each disc defining substantially a planar area contained within an outer circumference, and between the outer circumference and a peripheral edge defining an opening of substantially smaller size than the area of the disc, and with the opening eccentrically located within the area defined by the circumference of the disc; a slot in each disc defined by a gap in the conductive material of the respective disc and with the slot extending from the opening within the disc to the circumference of the disc; and with the slot in one disc being passed through conductive material area at a substantially rotated location as related to the shape of the discs as related to the location of the slot in the other disc.

19. The variable resonator RF tuning device of claim 18, wherein the slot of one disc is located relative to the shape of the discs rotationally substantially 180° from the slot of the other side.

No references cited.

HERMAN KARL SAALBACH, *Primary Examiner.*

L. ALLAHUT, *Assistant Examiner.*